(12) United States Patent
Trageser et al.

(10) Patent No.: US 10,834,810 B2
(45) Date of Patent: Nov. 10, 2020

(54) CIRCUIT BOARD AND METHOD FOR PRODUCTION THEREOF

(71) Applicants: Schweizer Electronic AG, Schramberg (DE); Continental Automotive GmbH, Hannover (DE)

(72) Inventors: Hubert Trageser, Igensdorf (DE); Alexander Neumann, Rottweil (DE)

(73) Assignees: Schweizer Electronic AG, Schramberg (DE); Continental Automotive GmbH, Hannover (DE)

( * ) Notice: Subject to any disclaimer, the term of this patent is extended or adjusted under 35 U.S.C. 154(b) by 0 days.

(21) Appl. No.: 16/324,504

(22) PCT Filed: Aug. 10, 2017

(86) PCT No.: PCT/EP2017/070360
§ 371 (c)(1),
(2) Date: Feb. 8, 2019

(87) PCT Pub. No.: WO2018/041595
PCT Pub. Date: Mar. 8, 2018

(65) Prior Publication Data
US 2019/0223286 A1     Jul. 18, 2019

(30) Foreign Application Priority Data

Aug. 30, 2016  (DE) .................. 10 2016 216 308

(51) Int. Cl.
*H05K 1/02*      (2006.01)
*H05K 3/02*      (2006.01)
(Continued)

(52) U.S. Cl.
CPC ............ *H05K 1/0256* (2013.01); *H05K 1/09* (2013.01); *H05K 3/061* (2013.01); *H05K 3/243* (2013.01);
(Continued)

(58) Field of Classification Search
CPC .... H05K 1/09; H05K 1/111–114; H05K 3/24; H05K 2201/0338; H05K 2201/0341; H05K 2201/0344; H05K 2201/0347
See application file for complete search history.

(56) References Cited

U.S. PATENT DOCUMENTS 4,104,111 A * 8/1978 MacK .................. H05K 3/062
174/257
4,572,925 A * 2/1986 Scarlett ................ H05K 3/062
174/257
(Continued)

FOREIGN PATENT DOCUMENTS

DE        69501243 T2      1/1998
DE     102011082537 A1     3/2013

OTHER PUBLICATIONS

US 5,284,696 A, 02/1994, Sato et al. (withdrawn)
(Continued)

*Primary Examiner* — Hoa C Nguyen
(74) *Attorney, Agent, or Firm* — Shlesinger, Arkwright & Garvey, LLP

(57) ABSTRACT

A circuit board (10, 10', 10") includes at last one insulating substrate layer (SL1, SL2, SL3, SL4, SL5) and a plurality of electrically conductive copper coats (C1, C2, C3) arranged on the at least one insulating substrate layer (SL1, SL2, SL3, SL4, SL5), wherein at least one of the electrically conductive copper coats (C1, C2, C3) is coated at least on both sides with a layer (HSI, HS2, HS3) made of a material for inhibiting electromigration, wherein on a layer (HS1, HS2) made of a material for inhibiting electromigration a further metal layer (M1, M2, M3, M3') is provided, which is in turn coated with a further layer (HS3, HS3') made of a material for inhibiting electromigration.

15 Claims, 4 Drawing Sheets

(51) Int. Cl.
*H05K 1/09* (2006.01)
*H05K 3/24* (2006.01)
*H05K 3/34* (2006.01)
*H05K 3/38* (2006.01)
*H05K 3/42* (2006.01)
*H05K 3/06* (2006.01)

(52) U.S. Cl.
CPC ........... *H05K 3/244* (2013.01); *H05K 3/3452* (2013.01); *H05K 3/388* (2013.01); *H05K 3/421* (2013.01); *H05K 3/428* (2013.01); *H05K 3/429* (2013.01); *H05K 3/06* (2013.01); *H05K 2201/0338* (2013.01); *H05K 2201/0769* (2013.01); *H05K 2201/0989* (2013.01)

(56) References Cited

U.S. PATENT DOCUMENTS

| | | | |
|---|---|---|---|
| 5,738,931 A | 4/1998 | Sato et al. | |
| 6,242,349 B1 | 6/2001 | Nogami et al. | |
| 9,150,002 B2 * | 10/2015 | Lee | H05K 1/09 |
| 2003/0102160 A1 * | 6/2003 | Gaudiello | H05K 3/244 |
| | | | 174/262 |
| 2004/0185683 A1 | 9/2004 | Nakamura | |
| 2008/0000678 A1 | 1/2008 | Johnston et al. | |
| 2010/0071940 A1 * | 3/2010 | Ejiri | H05K 3/244 |
| | | | 174/257 |
| 2010/0078208 A1 | 4/2010 | Inoue | |
| 2011/0162876 A1 * | 7/2011 | Arvin | C23C 18/1653 |
| | | | 174/257 |
| 2011/0253431 A1 | 10/2011 | Park et al. | |

OTHER PUBLICATIONS

International Search Report, PCT/EP2017/070360, dated Sep. 1, 2018.

German Search Report, Priority Application 10 2016 216 308.6, dated May 5, 2017.

* cited by examiner

CIRCUIT BOARD AND METHOD FOR PRODUCTION THEREOF

TECHNICAL FIELD

The present invention relates to a circuit board and to a method for producing a circuit board.

DESCRIPTION OF THE PRIOR ART

Circuit boards are used, for example, in motor vehicles for electronic regulation and control of a vehicle transmission. Conventionally, the circuit boards are in this case configured as rigid circuit boards, which on the one hand electrically connect discrete component and large-scale-integrated modules to one another and on the other hand act as carriers of these.

To this end, the circuit boards consist of one or more substrate layers of glass fiber-reinforced cured epoxy resin, which are masked with copper on one or both sides in order to form electrically conductive structures, in particular conductor tracks. In the case of multilayer circuit boards, one or more of these substrate sheets is/are pressed with so-called prepregs and sometimes also additionally with copper foils. The substrate panels and prepregs form electrically insulating substrate layers of the multilayer circuit board.

The insulated conductor tracks between electrically insulating substrate layers are electrically connected to one another in the circuit board by metallized bores, also known as through-contact. The various production methods of through-contacts are known from the prior art. Conventionally, first a hole is bored through a plurality of electrically insulating substrate layers of the circuit board, and this hole is cleaned. Subsequently, the nonconductive borehole wall is rendered electrically conductive before galvanic copper reinforcement is carried out. Blind holes are a further alternative embodiment of an electrical connection possibility of insulated conductor tracks.

During operation of the circuit board, continuously applied high DC voltages at supply potentials also generate static electric fields in the insulation material (FR4) within the circuit board. The electric fields cause copper ion migration into the insulation material. Buildups resulting therefrom in the course of time may lead to hazardous breakdowns through the insulation layer. Since fibers which are conducted because of the buildups are formed starting from a cathode of a circuit of the circuit board and grow below a substrate layer surface in the direction of an anode of the circuit, this phenomenon is known in the specialist field as CAF (for Conductive Anodic Filament). The formation of such conductive fibers can therefore lead to a short circuit between at least two conductor tracks and therefore to damage, even to the extent of destruction of the circuit board.

Necessary for formation of the conductive fibers are reduced bonding of the substrate panels (for example in the case of glass fiber-reinforced epoxy resin panels) and electrochemical corrosion. Reduced bonding may for example occur because of mechanical stress, thermal stress and/or moisture. Electrochemical corrosion is, in particular, promoted by moisture being present.

The technical field has to date sought to restrict the occurrence of this phenomenon by complying with design rules, for example complying with minimum distances (cf. for example "Gefährlicher Kurzschluss im BCP bei hohen Spannungen" [Hazardous short circuit in BCP at high voltages] by Dirk Müller, Elektronikpraxis No. 19 of Oct. 6, 2014, pages 54 to 56).

It is known from DE 10 2011 082 537 A1, in order to protect circuit boards employed in an aggressive environment (for example in transmission oil), to coat copper faces arranged on the surface for fitting with electronic components or copper faces for electrical connection of at least two layers of the circuit board as well as uncovered conductor tracks with a further metal.

SUMMARY OF THE INVENTION

On the basis of this, the invention suggests a circuit board having the features as disclosed herein, and a method for producing a circuit board having the features as disclosed herein.

The invention is based on the concept of providing the conductive copper layers of a circuit board with a material layer inhibiting electromigration at least on both sides, in order to reduce the risk of the occurrence of the described CAF effect. In this case, it is not important whether the copper layer is uncovered on the surface of the circuit board or in another way (for example a copper coating of a through-bore of the circuit board), or whether it is an inner-lying or "buried" copper layer. On at least one of the inhibition layers applied on both sides, a further metal layer is provided, for example in order to reinforce and/or improve the conduction properties. An inhibition layer is likewise applied on this further metal layer.

In the present context, both sides is in this case intended to mean the two surfaces extending perpendicularly to the extent direction of the copper layer.

In addition, provision may be made also to coat the side edges of the copper layers with a material inhibiting electromigration, so that coating on all sides with an inhibition layer is produced. This may involve the same material as the inhibition layers on the two surfaces of the respective uppermost layer, or alternatively different materials, as will be explained in more detail below with the aid of exemplary embodiments.

According to the invention, at least one of the conductive copper layers of a circuit board is thus coated on both sides with a layer of a material which has an electromigration-inhibiting effect. Suitable materials include, for example, zinc or brass (copper-zinc alloy) or nickel, or a nickel compound (for example NiP). Nickel or nickel compounds may, for example, be used in layer sequences with other suitable materials, for example nickel-gold or nickel-palladium-gold. Tin or others may also be considered as inhibition layer materials. Nonmetallic materials may in principle also be envisioned, for example polyamide or others. The choice of a suitable material is within the scope of the knowledge of the person skilled in the art with a view to the specific requirements of the circuit board in question, or taking into account method-technology requirements.

The invention is based on the discovery that abatement (reduction or elimination) of the CAF effect is possible when the electromigration to which the CAF is due, i.e. the migration or diffusion of ions from the conductor material because of an anode/cathode effect of two conductive copper layers arranged in or on the circuit board, can be prevented or at least made difficult. This is achieved by setting up a barrier in the form of a layer of a material inhibiting electromigration (inhibition layer). This inhibition layer is to be provided on both sides of the conductive copper layer, since particularly in the case of inner-lying (internal) copper layers a potential difference occurs, or may occur, on both sides of the copper layer.

The comments above apply both for outer-lying (external) and (in particular) internal conductive copper layers, both as conductor tracks and as through-bores or buried bores in a multilayer structure.

By means of the invention, it becomes possible to apply a thin inhibition layer, for example with a layer thickness in the range of several hundreds of nanometers, on (internal) electrically conductive copper structures, by means of which layer the CAF effect mentioned in the introduction can be reliably avoided, or at least the risk of a CAF effect can be significantly reduced. The lifetime of the circuit board is thereby increased in comparison with the prior art.

Internal copper structures are, in particular, intended to mean the copper structures and/or through-contacts arranged between the substrate layers in multilayer circuit boards. In the case of double-sided circuit boards, they may likewise mean through-contacts or other copper structures extending through the substrate layer.

According to one configuration of the invention, a multiplicity of substrate layers are provided, the copper layers or copper structures between the substrate layers being electrically conductively connected to one another by means of at least one through-contact and/or at least one buried bore. In this case, a bore for the at least one through-contact or for the at least one buried bore is respectively provided with an inhibition layer. The risk of the occurrence of a CAF effect is thereby reduced further.

On the inhibition layer of the bore or through-contact, a further metal layer is applied in order to increase an electrical conductance of the through-contact, or of the buried bore.

A minimization of the CAF risk is achieved in that the respective uppermost inhibition layer fully encloses the underlying copper layers and metal layers, i.e. it also covers their side faces.

The inhibition layers of the internal electrically conductive copper structures and of the through-contact may be formed both in the same way and differently in terms of material. In particular, corrosion properties and adhesion properties for subsequent layers are to be taken into account in the selection of the material for the inhibition layers.

Since potential differences, which may represent the cause of a harmful electromigration, may also occur on the surface of a circuit board, it is recommendable also to provide an inhibition layer respectively on the uncovered copper layers on the surface of the circuit board. In this case as well, full (i.e. also lateral) coverage of the uncovered copper or metal layers is recommendable. In the case of circuit boards having a so-called solder resist covering, an inhibition layer is provided between the external copper structure and the solder resist. In the regions free of solder resist, this innovation layer may differ from the inhibition layer below the solder resist. Criteria for the respective material are costs, solder properties, adhesion properties, or in general matching of the properties to the further preparation or processing on this upper layer.

The circuit board formed according to the invention has reduced CAF effects compared with known circuit boards, so that its lifetime is significantly increased, and possibly hazardous failures during operation are reduced significantly. According to the invention, CAF effects between the electrically conductive copper layers or copper structures or (if present) between the electrically conductive copper layers and at least one through-contact and/or at least one buried bore, but also between through-contacts or buried bores and/or between further conductive structures, are avoided or at least reduced.

Further advantages and configurations of the invention may be found in the description and the appended drawings.

It is to be understood that the features mentioned above and those yet to be explained below may be used not only in the combination respectively indicated, but also in other combinations or separately, without departing from the scope of the invention.

The invention is schematically represented with the aid of exemplary embodiments in the drawing, and will be described in detail below with reference to the drawing. It should be stated that the representations in the figures of the drawing are highly schematic and not true to scale. Furthermore, the individual layer levels of the circuit board structures represented are represented exaggeratedly thick for better clarity.

DETAILED DESCRIPTION

Parts which correspond to one another are provided with the same references in all the figures.

Figure 1:
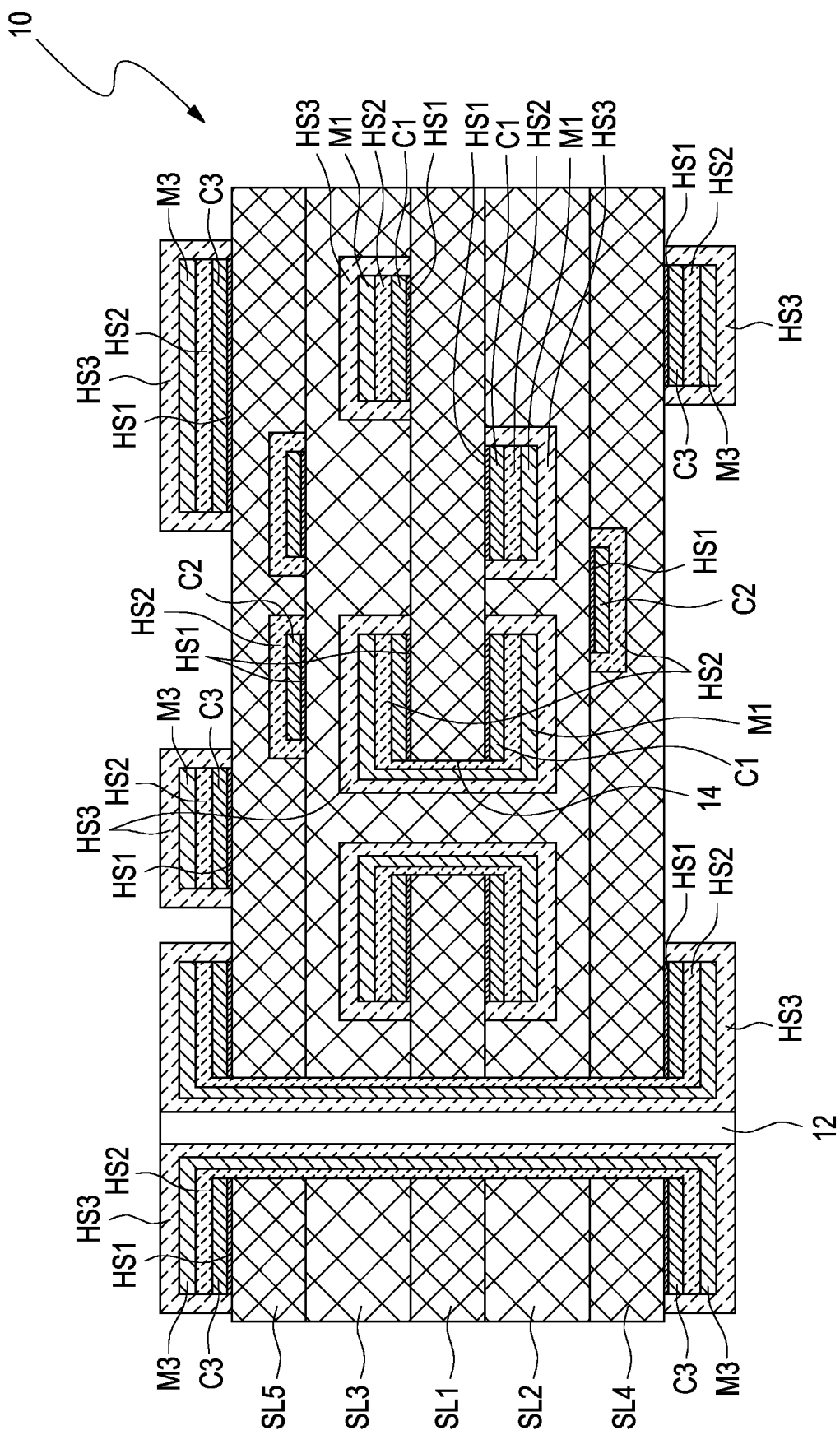
FIG. 1 shows a schematic sectional representation of one exemplary embodiment of a multilayer circuit board according to the invention.

FIG. 1 shows a schematic sectional representation of one exemplary embodiment of a circuit board 10 according to the invention. The section plane of the representation extends essentially perpendicularly to an extent plane spanned by the circuit board 10.

The circuit board 10 comprises a layer structure known per se, consisting of a multiplicity of electrically insulating substrate layers SL1, SL2, SL3, SL4 and SL5, namely a central substrate layer SL1, inner-lying substrate layers SL2, SL3 respectively arranged below and above the central layer, and external substrate layers SL4, SL5 respectively adjacent to the two inner-lying substrate layers SL2, SL3. The substrate layers SL1 to SL5 are, for example, formed from a glass fiber-reinforced epoxy resin. The substrate layers SL1 SL5 are firmly connected to one another, for example by pressing or adhesive bonding.

The substrate layers SL1 to SL5 comprise electrically conductive copper layers C1, C2 and C3. The electrically conductive copper layers C1 to C3 form electrically conductive structures or layers within the circuit board 10. In particular, the copper layers C1 to C3 are used as conductor tracks or conductor paths and are used for electrical connection of electronic component parts (not represented), with which the circuit board 10 is fitted and which from a circuit arrangement. For instance, electronic component parts (not represented), for example transistors, resistors, semiconductor components and the like may be arranged on one or both of the external substrate layers SL4, SL5 and electrically connected to the electrically conductive copper layers by means of soldering, bonding and/or adhesive bonding.

According to the invention, the copper layers C1 to C3 have a lower inhibition layer HS1 and an upper inhibition layer HS2 respectively on a lower side and an upper side. In the present case, an inhibition layer is intended to mean a layer of a material which is suitable for inhibiting electromigration from the neighboring metal (copper) layer. Such materials may (not exclusively), be zinc, brass, nickel compounds such as nickel-gold (NiAu) or nickel-palladium-gold (NiPdAu), or alternatively tin or nonmetallic materials.

The terms "lower side" and "upper side" of a copper layer are in the present case respectively intended to mean a surface facing toward the associated substrate layer or close the substrate layer (lower side), and a surface facing away from the associated substrate layer or remote from the substrate (upper side), independently of whether the copper layer is applied above or below the substrate layer (i.e. independently of the orientation of the representation in the figure). Or, in other words the terms "lower side" and "upper side" are independent of "above" and "below" in the figure representation, but instead relate to the relationship between the substrate layer and the copper layer.

In order, as already explained in the introduction, to reinforce the copper layers C1 to C3 and/or increase their conductance, all or some of the copper layers C1 to C3 may be coated with a further metal layer. In the exemplary embodiment represented, the first copper layers C1 on the central substrate layer SL1 and the third copper layers C3 on the outer substrate layers SL4 and SL5, respectively, are provided with a further metal layer M1 or M3 on their respective inhibition layer. However, fewer or further copper layers may also be provided with a further metal layer.

In the case of bores (through-contacts, vias, buried bores, blind holes), the further metal layer represents the metallization of the bore inner wall which is conventional in the prior art.

According to the invention, the further metal layer is applied on the respective upper inhibition layer HS2 of the corresponding copper layer C1, C3. A further inhibition layer HS3 is applied on the further metal layer M1, M3. Besides protection against the CAF effect, this also leads to corrosion protection.

In the case of the further inhibition layer HS3 on the outer levels, i.e. the uncovered inhibition layer, it is recommendable to form it from a corrosion-resistant and/or readily solderable material (or a material sequence), for example NiAu or NiPdAu. As an alternative, in this case as well a zinc layer or a layer containing zinc is also possible. As already indicated, it is however also possible to form this uncovered inhibition layer directly on the copper layer 3 when a required conductance of this copper layer is achieved even without a further metal layer M3.

In the scope of their technical knowledge depending on design-technology and method-technology requirements, the person skilled in the art may decide whether the inhibition layers should all consist of the same material or should consist of different materials. In principle, any desired material combination of inhibition layers within a circuit board is possible.

In the exemplary embodiment represented, outer copper structures C3 are electrically conductively connected to one another by means of a through-contact 12. The through-contact 12 is produced by a bore through the substrate layers SL1 to SL5. As a first layer inside the bore, the inhibition layer HS2 is provided, with which the outer copper layer C3 is also coated. This has the effect that the further metal layer M3 subsequently provided in order to increase the electrical conductance is protected with respect to other electrically conductive structures in the multilayer circuit board 10 against CAF effects (this inhibition layer HS2 therefore represents the lower inhibition layer for the further metal layer M3, while at the same time it represents the upper inhibition layer in relation to the outer copper layer C3). The inhibition layer HS2 may be applied in one working step both on the copper layer C1/C3 and on the bore inner wall. It may, however, also be recommendable to apply the inhibition layer on the copper layer C1/C3 and on the bore inner wall in separate working steps, for example when different materials are desired.

The inhibition layer HS3 of the external substrate layers SL4 and SL5, which may for example (as already mentioned) be formed as a nickel-gold layer or nickel-palladium-gold layer or even as a zinc layer or brass layer, is then applied on the further metal layer M3 in the bore 12.

The electrically conductive copper layers C2 applied on the two inner-lying substrate layers SL2 and SL3 also have on their upper side a thin inhibition layer HS2, which is preferably corrosion-resistant. Solderability of this inhibition layer HS2 on the inner-lying copper layers C2 is not absolutely necessary since no electronic component parts are applied on these copper layers. If fitting of inner-lying surfaces with electronic components is intended, good solderability of the inner-lying inhibition layer HS2 would correspondingly also be required.

In the exemplary embodiment represented, the inhibition layer HS2 on the inner-lying copper layer C2 is formed from a zinc layer or brass layer. Zinc and brass are particularly highly suitable as corrosion protection and form a barrier on the electrically conductive copper structures against release of copper constituents of the electrically conductive copper structures. The CAF effect is thereby reliably avoided or at least reduced.

The exemplary embodiment represented furthermore comprises a so-called buried bore 14, also referred to as a "buried via". By means of the buried bore 14, inner-lying copper structures C1 of the central substrate layer SL1 are electrically conductively connected to one another. In a similar way to the through-contact 12, the buried bore 14 has a thin inhibition layer HS2 on an inner wall in order to reliably avoid or at least minimize the CAF effect. A further metal layer M1 is applied on the inhibition layer HS2, and an inhibition layer HS3 is in turn provided on this metal layer in order to also protect the further metal layer M1 against the CAF effect. Both the base copper layer C1 and the further metal layer M1 therefore have respectively an inhibition layer on both sides, the upper inhibition layer of the copper layer representing the lower inhibition layer of the further metal layer.

The exemplary embodiment of FIG. 1 serves merely for illustration purposes. In particular, it should be stated that the invention is not restricted to the represented combination of internal and external layers, as well as through-contacts and buried bores, but that any desired combinations of these elements are available to the person skilled in the art when designing a circuit board structure.

Figure 2:
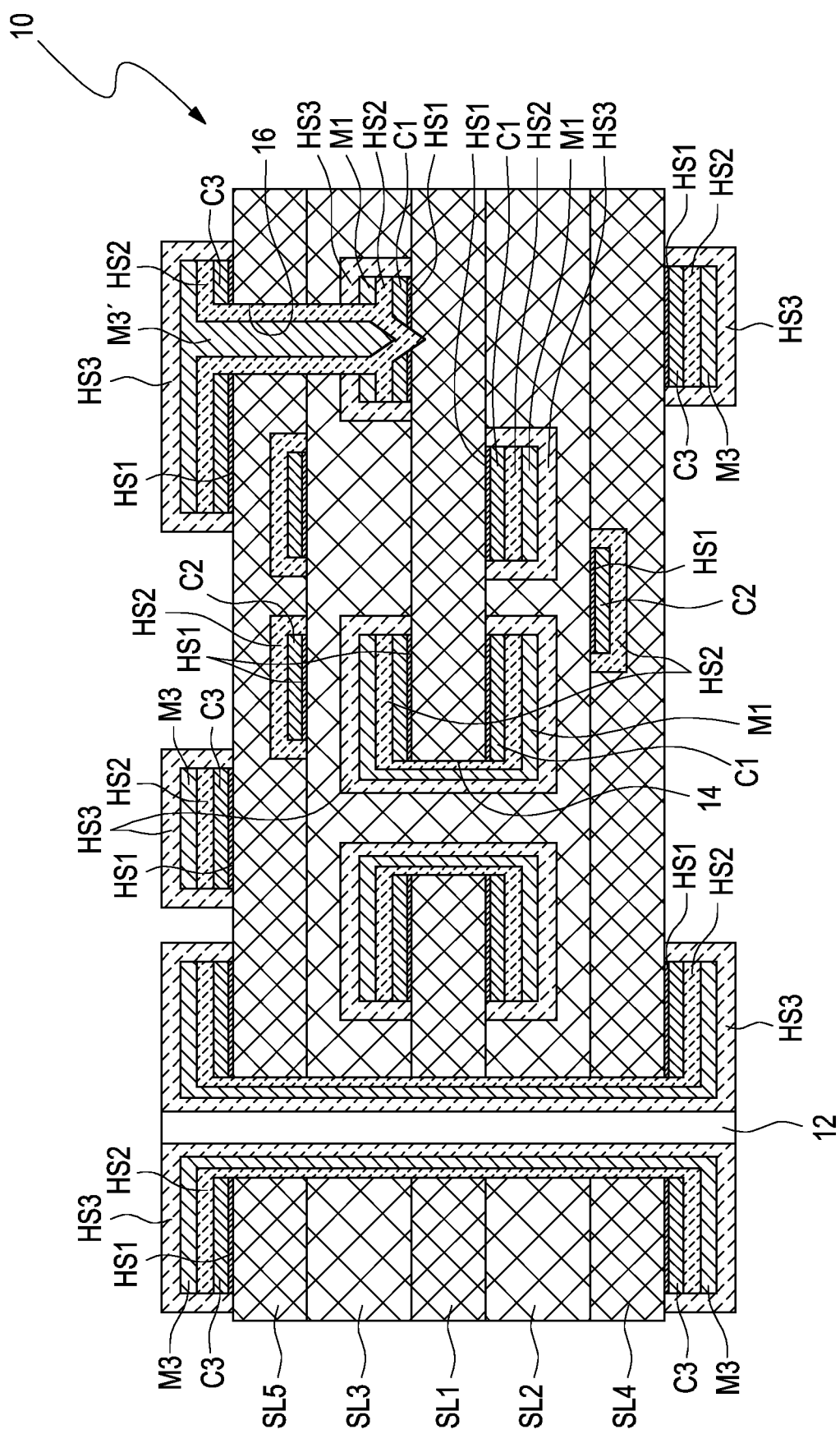
FIG. 2 shows a schematic sectional representation of an alternative exemplary embodiment of a multilayer circuit board according to the invention with a blind hole.
Figure 3:
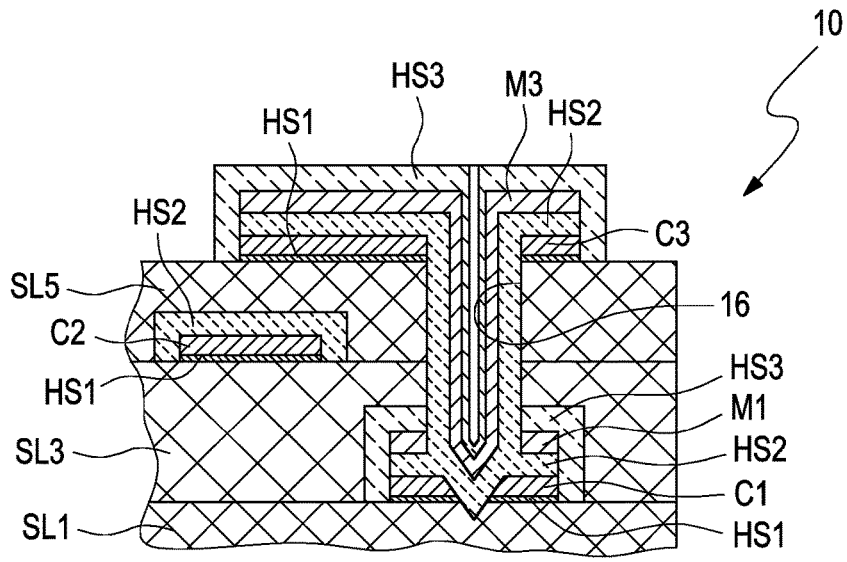
FIG. 3 shows a detail of the circuit board of FIG. 2 with an alternatively configured blind hole as a further exemplary embodiment.

In the exemplary embodiments of FIGS. 2 and 3, in addition the circuit board 10 also comprises a so-called blind hole 16 (blind via). The blind hole 16 electrically conductively connects the electrically conductive copper layer C3 of the upper (in the representation of the figures) external substrate layer SL5 to the electrically conductive copper layer C1 of the central substrate layer SL1. The blind hole 16 is furthermore provided with an inhibition layer HS2, which is formed in a similar way to the described inhibition layer HS2 of the through-contact 12 and is applied directly onto an inner wall of the blind hole 16.

Expediently, the inhibition layers HS2 of the through-contact 12 and of the blind hole 16 are deposited simultaneously in the production method. As an alternative, however, this may also be carried out at different times.

In order to increase the electrical conductance, the inhibition layer HS2 is coated with a further metal layer. In the case of the exemplary embodiment of FIG. 2, this may be a complete metal filling M3'. As an alternative thereto, however, it may also be a metal layer M3 which follows the deepening of the blind hole 16, as is shown by way of example in FIG. 3. In both variants, an inhibition layer HS3 is then again formed on the metal layer M3 or M3'. In the example of FIG. 2, the inhibition layer HS3 closes off the blind hole 16 horizontally, while in the example of FIG. 3 the inhibition layer HS3 extends along the metal layer M3 into the blind hole 16.

As can be seen in the representations of FIGS. 2 and 3, the inhibition layer HS2 of the blind hole 16 is led out onto the upper external substrate layer SL5 and extends in a section parallel to the surface of the substrate layer SL5, while covering the copper layer C3 arranged on the upper external substrate layer SL5. This led-out section of the inhibition layer HS2 is in turn provided with a material of the metal filling M3, M3', which is applied as a layer on the external section of the inhibition layer HS2.

Figure 4:
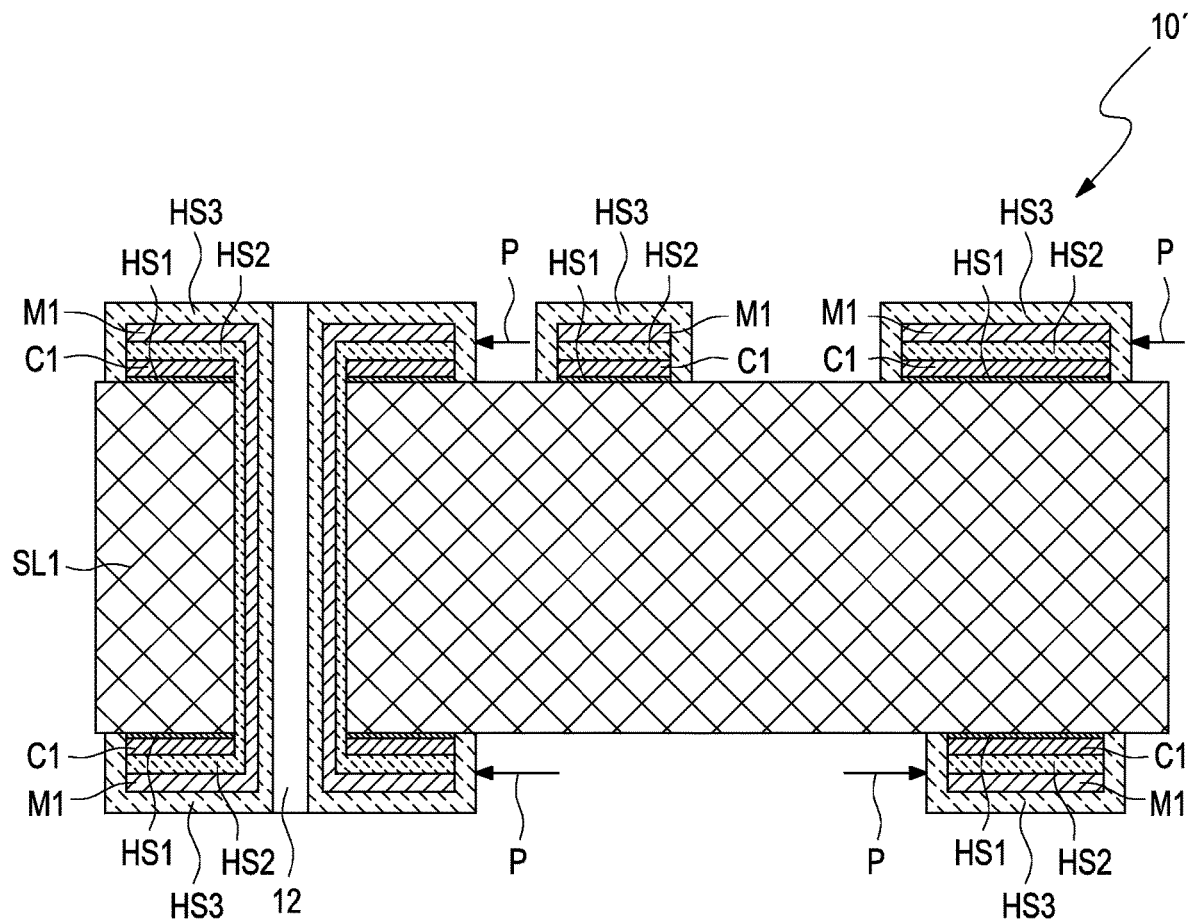
FIG. 4 shows as a further exemplary embodiment a schematic sectional representation of a two-layer circuit board according to the invention.

FIG. 4 shows as a further exemplary embodiment a schematic sectional representation of a two-layer circuit board 10' according to the invention having only one substrate layer SL1 and a through-contact 12.

The circuit board 10' of the exemplary embodiment of FIG. 4 is configured as a double-sided circuit board, on the opposite outer surfaces of which electrically conductive copper structures C1 are applied, these being electrically conductively connected to one another by means of the through-contact 12.

In order to produce a circuit board according to the invention, the person skilled in the art may use materials and method sequences which are known per se, and which therefore need not be explained in detail and at length below.

In the simple case of the exemplary embodiment represented in FIG. 4, a substrate layer SL1 is provided, on which a first copper layer C1 is applied or deposited in a manner known per se after a first inhibition layer HS1 has been applied. As an alternative, the copper layer C1 may be applied with the aid of a copper foil which already comprises on one side a layer with a material suitable as an inhibition layer. Lastly, as a further alternative, a copper-masked substrate layer may be provided, on which a layer suitable as an inhibition layer is likewise already present below the copper layer (i.e. between the substrate layer and the copper layer). Typically, suitable copper foils with a brass coating to improve the adhesion properties of the Cu foil are commercially available.

Subsequently, a further inhibition layer (inhibition layer HS2) is applied onto the copper layer C1. This may be done currentlessly or galvanically (for example electroless zinc deposition or chemical deposition of brass) respectively with a predetermined layer thickness of at least 100 nm, typically from 100 nm to 1500 nm. It would also be conceivable to produce brass from the Cu structures and a zinc coating by carrying out a thermal process during the production of the multilayer circuit board.

In the case of applying a through-bore, as in the case of the through-contact 12 of FIG. 4, the boring step is carried out before the application of the second or upper inhibition layer HS2. Then, the inhibition layer HS2 may subsequently also be introduced into the bore in order to cover the inner wall of the through-contact in one method step (after the inner wall has previously been cleaned and made capable of receiving deposition in the manner known to the person skilled in the art). The inhibition layer HS2 may be chemically deposited on the inner wall of the through-contact (or also of the buried bore according to the exemplary embodiments of FIGS. 1 and 2). For example, this is done with chemical bath deposition. The electrically nonconductive borehole wall is to this end previously rendered conductive by means of a circuit board technique known to the person skilled in the art, in order to provide it with the inhibition layer by means of a galvanic process.

The further metal layer M1 may subsequently be deposited galvanically onto the inhibition layer. To this end, for example, copper is deposited on the inhibition layer. The inhibition layer in these cases consists of a suitable metal, or a suitable metal compound, so as to permit the subsequent galvanic deposition.

In an etching process, the desired conductor structures are provided by etching the applied layers down to the substrate layer, and in a subsequent step the deposition of a further (in the case of the example of FIG. 4 outer) inhibition layer HS3 is carried out. The further inhibition layer HS3 is applied in such a way that it covers the conductor structures fully, i.e. not only on the surface but also laterally (conductor side edges) as can be seen clearly in the figures and is illustrated in FIG. 4 by means of drawn arrows P. In particular, the further inhibition layer HS3 also extends through the entire through-contact 12 (or alternatively the buried bore 14 of FIG. 1).

If a PCB is intended to comprise a plurality of substrate layers, the described process is repeated by pressing the first (central) substrate layer SL1 with the structures provided thereon together with further substrate layers SL2, SL3, on which in turn further copper layers are correspondingly applied and/or boring is carried out. For example, the circuit board shown in the exemplary embodiment of FIG. 4 may be used as a basis for pressing together with further substrate layers applied above and below. By entry of the resin liquefied during the pressing process into the through-bore, a buried bore is then provided.

On electrically conductive copper layers of external substrate layers (such as the copper layer C1 in the exemplary embodiment of FIG. 4 or the copper layer C3 in the case of the exemplary embodiments of FIGS. 1 to 3), a metal or a metal compound is preferably likewise respectively, for example, electrolessly deposited in order to form an external inhibition layer HS3. For example, a nickel-gold compound is chemically deposited as a metal compound. Care is additionally be taken regarding solderability of the material for the inhibition layer of external copper layers, for which reason nickel-gold is particularly suitable. As an alternative, a less expensive material, for example zinc or tin, may also be used.

Figure 5:
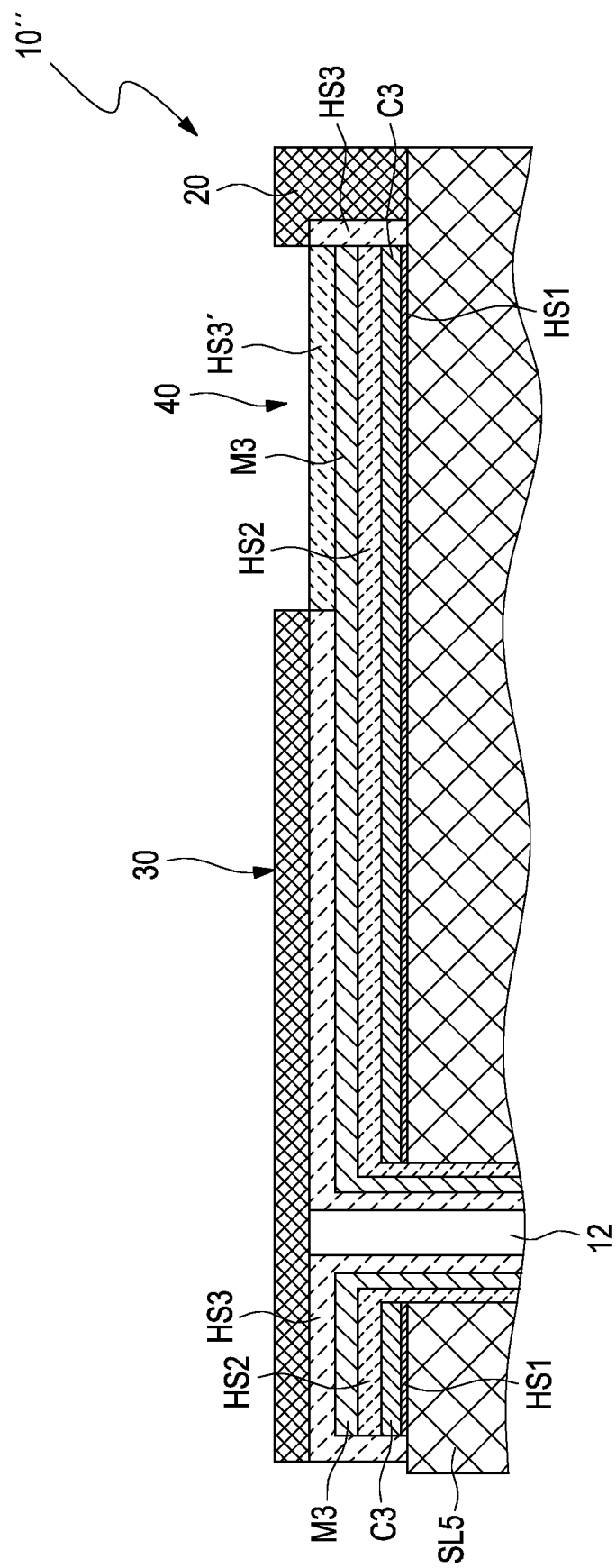
FIG. 5 shows as a further exemplary embodiment a schematic sectional representation of a detail a surface of a circuit board according to the invention with solder resist covering.

In the case of circuit boards in which a solder resist covering is to be provided on the surface, the procedure may for example be carried out as in the further exemplary embodiment represented in FIG. 5.

FIG. 5 shows a schematic sectional representation of a detail of a surface of a circuit board 10" according to the invention, having a solder resist covering 20 applied on the surface. In a similar way as in the exemplary embodiment of FIG. 1, the circuit board 10" has a through-contact 12 on the left-hand side in the representation of FIG. 5. On the surface of the circuit board, i.e. on the upper side of the upper substrate layer SL5, the layer sequence according to the invention, consisting of a lower inhibition layer HS1, a copper layer C3, an upper inhibition layer HS2, a further metal layer M3 and a further inhibition layer HS3, forms a conductor track 30 which leads to a connection position 40 on the right-hand side of the circuit board 10". The connection position 40 is free of solder resist but otherwise enclosed by the solder resist covering 20.

In order to form the connection position 40, the following procedure is carried out: after the application of the further metal layer M3 as described, and the subsequent etching process to form the conductor track 30, an inhibition layer HS3 is applied, which fully covers the further metal layer and also (at the edges) the underlying layers. The inhibition layer HS3 is preferably a material which is economical but performs well in the inhibition of electromigration, for example zinc or brass. Next, the inhibition layer HS3 covering 20 over the entire surface of the circuit board 10" and are covered with the solder resist. In the region of the connection position to be formed, the solder resist is removed, i.e. the connection position is uncovered. The further inhibition layer HS3 of zinc or brass is then removed again in the uncovered region, and as an alternative material a further inhibition layer HS3' of nickel or a nickel compound, or a layer sequence comprising nickel or a nickel compound, is applied (NiAu or NiPdAu). A or the soldering process, an adhesive-bonding process or a wire-bonding process may then be carried out on this connection position 40. Besides the costs (a layer of zinc or brass is much more economical than a layer sequence comprising gold or palladium), criteria for the material selection are in this case the respective properties of the materials in relation to the further preparation or processing on the respective inhibition layer (such as adhesion properties for solder resist, soldering properties for the connection position, etc.).

Of course, the described procedure may also be carried out in a different geometry or with a different layer structure, for example without a further metal layer M3.

The invention claimed is:

1. A circuit board, comprising:
    at least one insulating substrate layer and a multiplicity of electrically conductive copper layers arranged on the at least one insulating substrate layer; and
    at least one of the electrically conductive copper layers is coated on both sides with an intermediate layer and an upper layer, respectively, for inhibiting electromigration, a further metal layer being provided on the upper layer for inhibiting electromigration, which further metal layer is in turn coated with a further layer for inhibiting electromigration, the intermediate layer being disposed between the at least one insulating substrate layer and the at least one of the electrically conductive copper layers.

2. The circuit board as claimed in claim 1, wherein at least one bore is provided, which connects at least two copper layers and on an inner wall of which the further layer for inhibiting electromigration is applied.

3. The circuit board as claimed in claim 2, wherein the bore is a through-contact, a buried bore or a blind hole.

4. The circuit board as claimed in claim 1, wherein a material for inhibiting electromigration is zinc, brass, a layer sequence comprising nickel or a nickel compound.

5. The circuit board as claimed in claim 1, and further comprising a solder resist covering, the further layer for inhibiting electromigration being provided between an uppermost copper layer and the solder resist covering.

6. The circuit board as claimed in claim 5, wherein a region used to form a connection position does not have a solder resist covering, and a surface material of the connection position is formed by an inhibition layer of a material for inhibiting electromigration, which is a different material than the further layer for inhibiting electromigration provided below the solder resist covering.

7. A method for producing a circuit board, the method comprising the following steps:
    forming a layer sequence of a substrate layer and a copper layer with an intermediate layer for inhibiting electromigration;
    applying an upper layer for inhibiting electromigration onto the copper layer;
    depositing a further metal layer onto the upper layer for inhibiting electromigration;
    etching the layer sequence formed, in order to form conductor structures;
    depositing a further layer for inhibiting electromigration.

8. The method as claimed in claim 7, wherein the forming step comprises the following steps:
    providing a substrate layer;
    applying the intermediate layer for inhibiting electromigration onto the substrate layer;
    applying the copper layer.

9. The method as claimed in claim 7, wherein the forming step comprises the following steps:
    providing the substrate layer;
    providing a copper foil which has a bonding layer suitable for inhibiting electromigration, the copper foil forming the copper layer;
    applying the copper foil onto the substrate layer in such a way that the bonding layer is applied in order to form an inhibition layer suitable for inhibiting electromigration on the substrate layer and comes to lie between the substrate layer and the copper layer formed by the copper foil.

10. The method as claimed in claim 7, wherein the forming step comprises providing a copper-masked substrate layer which has a layer suitable for inhibiting electromigration provided in between a copper sheet or lining forming the copper layer.

11. The method as claimed in claim 7, and further comprising, after the step of forming the layer sequence, the step:
    boring the substrate layer with the copper layer and the intermediate layer for inhibiting electromigration.

12. The method as claimed in claim 7, and further comprising the step of forming further circuit board layers by pressing together the layer sequence with further substrate layers.

13. The method as claimed in claim 7, wherein a material for inhibiting electromigration is selected from the group consisting of zinc, brass, nickel or nickel compounds.

14. The method as claimed in claim 13, wherein innerlying n layers for inhibiting electromigration are formed from zinc or brass or nickel compounds, and external layers for inhibiting electromigration are formed from nickel compounds.

15. The method as claimed in claim 7, and further comprising the step of forming a a connection position surrounded by solder resist on the circuit board with the following steps:

applying a solder resist covering on an external inhibition layer of a first material for inhibiting electromigration on the surface of a circuit board;

removing the solder resist in a region intended as a connection position above the inhibition layer;

removing the first material of the inhibition layer in the region intended as a connection position;

forming the connection position by applying a layer of a second material for inhibiting electromigration in the uncovered region.

* * * * *